United States Patent
Lin et al.

(10) Patent No.: US 10,157,879 B2
(45) Date of Patent: Dec. 18, 2018

(54) DIE-TO-DIE GAP CONTROL FOR SEMICONDUCTOR STRUCTURE AND METHOD

(71) Applicant: Taiwan Semiconductor Manufacturing Company, Ltd., Hsin-Chu (TW)

(72) Inventors: Jing-Cheng Lin, Hsin-Chu (TW); Szu-Wei Lu, Hsin-Chu (TW); Ying-Ching Shih, Hsin-Chu (TW); Ying-Da Wang, Taipei (TW); Li-Chung Kuo, Taipei (TW); Long Hua Lee, Taipei (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 14/593,948

(22) Filed: Jan. 9, 2015

(65) Prior Publication Data

US 2015/0125994 A1 May 7, 2015

Related U.S. Application Data

(62) Division of application No. 13/221,447, filed on Aug. 30, 2011, now Pat. No. 8,963,334.

(51) Int. Cl.
*H01L 21/50* (2006.01)
*H01L 23/00* (2006.01)
(Continued)

(52) U.S. Cl.
CPC ............ *H01L 24/81* (2013.01); *H01L 21/563* (2013.01); *H01L 21/6835* (2013.01);
(Continued)

(58) Field of Classification Search
CPC ....... H01L 2924/00; H01L 2224/73204; H01L 2224/49171; H01L 21/563; H01L 2224/0603
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| CN | 1921085 A | 2/2007 |
| CN | 102017141 A | 4/2011 |

(Continued)

*Primary Examiner* — Jaehwan Oh
(74) *Attorney, Agent, or Firm* — Slater Matsil, LLP

(57) ABSTRACT

An embodiment is a structure comprising a substrate, a first die, and a second die. The substrate has a first surface and a second surface opposite the first surface. The substrate has a through substrate via extending from the first surface towards the second surface. The first die is attached to the substrate, and the first die is coupled to the first surface of the substrate. The second die is attached to the substrate, and the second die is coupled to the first surface of the substrate. A first distance is between a first edge of the first die and a first edge of the second die, and the first distance is in a direction parallel to the first surface of the substrate. The first distance is equal to or less than 200 micrometers.

20 Claims, 11 Drawing Sheets

(51) Int. Cl.
  *H01L 21/56* (2006.01)
  *H01L 21/683* (2006.01)
  *H01L 25/065* (2006.01)
  *H01L 25/00* (2006.01)
  *H01L 21/768* (2006.01)
  *H01L 23/538* (2006.01)
  *H01L 23/58* (2006.01)
  *H01L 23/498* (2006.01)

(52) U.S. Cl.
  CPC .... *H01L 21/76898* (2013.01); *H01L 23/5384* (2013.01); *H01L 24/97* (2013.01); *H01L 25/0652* (2013.01); *H01L 25/0655* (2013.01); *H01L 25/50* (2013.01); *H01L 21/6836* (2013.01); *H01L 23/49822* (2013.01); *H01L 23/49827* (2013.01); *H01L 23/585* (2013.01); *H01L 24/03* (2013.01); *H01L 24/05* (2013.01); *H01L 24/06* (2013.01); *H01L 24/11* (2013.01); *H01L 24/13* (2013.01); *H01L 24/16* (2013.01); *H01L 24/73* (2013.01); *H01L 2221/68327* (2013.01); *H01L 2224/0345* (2013.01); *H01L 2224/03452* (2013.01); *H01L 2224/03462* (2013.01); *H01L 2224/0401* (2013.01); *H01L 2224/0557* (2013.01); *H01L 2224/05569* (2013.01); *H01L 2224/05572* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05684* (2013.01); *H01L 2224/06181* (2013.01); *H01L 2224/11462* (2013.01); *H01L 2224/131* (2013.01); *H01L 2224/13111* (2013.01); *H01L 2224/13147* (2013.01); *H01L 2224/13155* (2013.01); *H01L 2224/16146* (2013.01); *H01L 2224/16225* (2013.01); *H01L 2224/16227* (2013.01); *H01L 2224/32225* (2013.01); *H01L 2224/73204* (2013.01); *H01L 2224/81192* (2013.01); *H01L 2224/81193* (2013.01); *H01L 2224/81815* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06548* (2013.01); *H01L 2924/00014* (2013.01); *H01L 2924/01029* (2013.01); *H01L 2924/01322* (2013.01); *H01L 2924/12042* (2013.01); *H01L 2924/14* (2013.01); *H01L 2924/157* (2013.01); *H01L 2924/15311* (2013.01); *H01L 2924/181* (2013.01); *H01L 2924/18161* (2013.01); *H01L 2924/3511* (2013.01); *H01L 2924/3512* (2013.01)

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,256,066 B2 * | 8/2007 | Chen | H01L 21/561 257/620 |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 7,915,080 B2 * | 3/2011 | Takahashi | H01L 21/56 257/E21.705 |
| 8,313,982 B2 * | 11/2012 | Dunne | H01L 21/563 257/621 |
| 2004/0124512 A1 * | 7/2004 | Tao | H01L 23/4334 257/678 |
| 2005/0202593 A1 * | 9/2005 | Chen | H01L 21/561 438/108 |
| 2006/0291029 A1 | 12/2006 | Lin et al. | |
| 2008/0001241 A1 * | 1/2008 | Tuckerman | B81C 1/00301 257/434 |
| 2008/0230913 A1 * | 9/2008 | Huang | H01L 21/6835 257/762 |
| 2009/0085217 A1 * | 4/2009 | Knickerbocker | H01L 21/486 257/774 |
| 2010/0159643 A1 * | 6/2010 | Takahashi | H01L 21/56 438/108 |
| 2010/0207266 A1 * | 8/2010 | Chang | H01L 21/563 257/692 |
| 2010/0326702 A1 * | 12/2010 | Dang | H01L 21/6835 174/250 |
| 2011/0042824 A1 | 2/2011 | Koide | |
| 2011/0044015 A1 | 2/2011 | Koide et al. | |
| 2011/0215480 A1 * | 9/2011 | Gorczyca | H01L 23/4985 257/774 |
| 2011/0223778 A1 * | 9/2011 | Chow | H01L 21/4853 439/66 |
| 2012/0070939 A1 * | 3/2012 | Dunne | H01L 21/563 438/110 |
| 2012/0182650 A1 * | 7/2012 | Chi | H01L 23/60 361/54 |
| 2012/0193661 A1 * | 8/2012 | Emerson | H01L 33/20 257/98 |

(56) References Cited

U.S. PATENT DOCUMENTS

2012/0319248 A1\* 12/2012 Rahman ................ H01L 23/147
                                                                                                        257/621

FOREIGN PATENT DOCUMENTS

| | | |
|---|---|---|
| DE | 102010036678 A1 | 2/2011 |
| JP | 2005167072 A | 6/2005 |
| JP | 4128945 B2 | 7/2008 |
| KR | 20110000730 | 1/2011 |
| WO | 2009132618 A1 | 11/2009 |

\* cited by examiner

2

DIE-TO-DIE GAP CONTROL FOR SEMICONDUCTOR STRUCTURE AND METHOD

This application is a divisional of U.S. Ser. No. 13/221,447, filed Aug. 30, 2011, entitled "Die-to-Die Gap Control for Semiconductor Structure and Method," which application is hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate.

Different packaging techniques taking advantage of an additional dimension have been used to achieve various objectives. One package is a chip or chips on an interposer. Interposers have been used to redistribute ball contact areas from that of the chip(s) to a larger area of the interposer. Another development is the stacking of dies on an active die. This also allows for a package to include multiple chips and reduces the package footprint.

During processing, the interposer or bottom active die in these packages generally includes through substrate vias (TSVs, also referred to as "through semiconductor vias" or "through silicon vias"), and other dies are typically attached to the interposer or bottom active die before the interposer or bottom die is singulated from a wafer. After a die attach step, the wafer comprising the interposer or bottom active die is usually further processed, which typically includes various thermal processes. The coefficient of thermal expansion (CTE) or shrinkage of underfill can cause the wafer to warp during the thermal process. The warpage can impart a stress to the TSVs or other components of the package, such as an underfill material or bumps. The stress can cause cracks in the TSVs, cracks in the bumps, or delamination of the underfill material.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a two and a half dimensional integrated circuit (2.5DIC) structure having dies attached to a passive interposer. Other embodiments may also be applied to a three dimensional IC (3DIC) having stacked active dies, a 2.5DIC structure having dies attached to an active interposer, or the like.

Figure 1A:
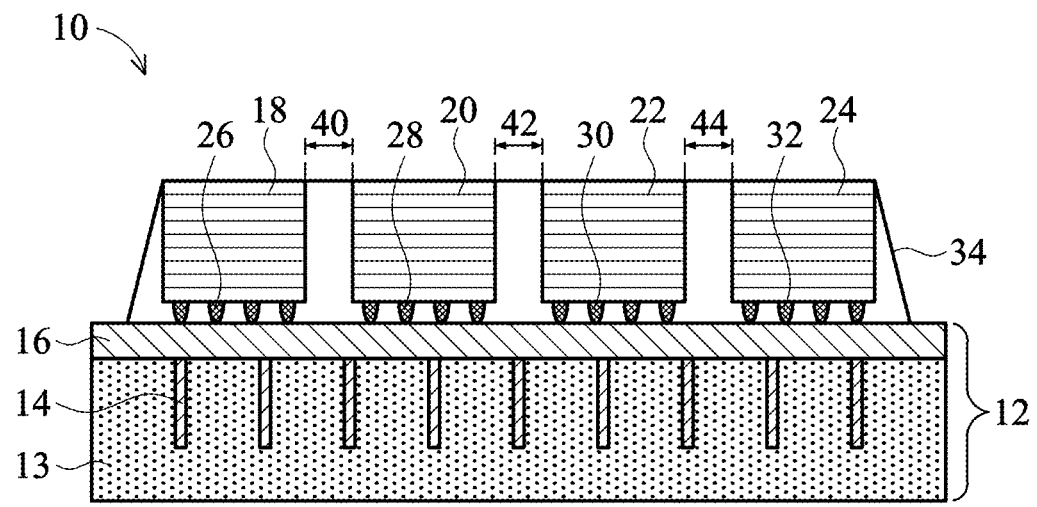
FIGS. 1A and 1B are a cross section view and a layout view, respectively, of a four die two and a half dimension integrated circuit (2.5DIC) structure according to an embodiment.
Figure 1B:
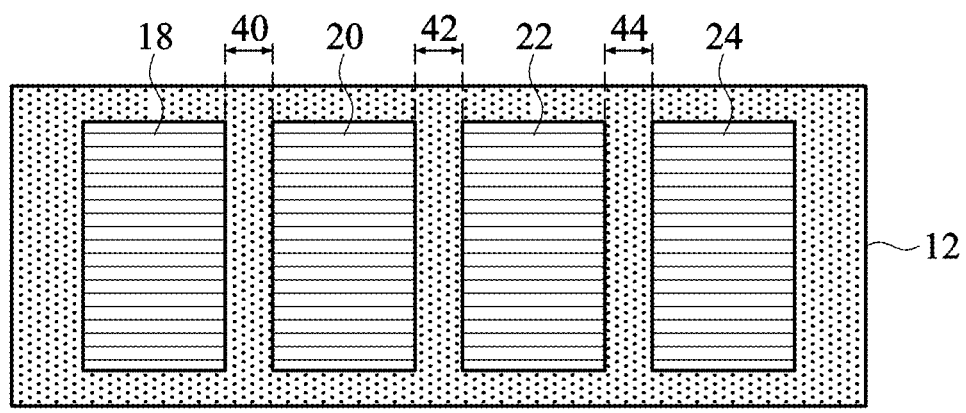

FIGS. 1A and 1B show a cross section view and a layout view, respectively, of a four die 2.5DIC structure 10 during processing according to an embodiment. The structure 10 comprises a passive interposer 12 with a first die 18, a second die 20, a third die 22, and a fourth die 24 attached by first connectors 26, second connectors 28, third connectors 30, and fourth connectors 32, respectively. The connectors 26, 28, 30, and 32 may be conductive bumps, such as microbumps, and may electrically and mechanically couple the respective die 18, 20, 22, and 24 to the passive interposer 12. The passive interposer 12 comprises through substrate vias (TSVs, also referred to in the art as "through semiconductor vias" or "through silicon vias") 14 in a substrate 13 and a redistribution layer (RDL) 16 on a front side surface of the substrate 13. Various bump bond pads are on the RDL 16 (not shown) and are connected to respective connectors 26, 28, 30, and 32. Various bump bond pads are electrically coupled to respective TSVs 14 through the RDL 16. An underfill material 34 is around and between the connectors 26, 28, 30, and 32, and between the interposer 12 and each of the dies 18, 20, 22, and 24. The underfill material 34 is also between adjacent dies, such as between the first die 18 and the second die 20, between the second die 20 and the third die 22, and between the third die 22 and the fourth die 24.

It is worth noting that another embodiment uses an active die comprising TSVs and active devices instead of the interposer 12 to realize a 3DIC structure. Further, the interposer 12 may have a device in the substrate 13 such that the interposer 12 may be referred to as an active interposer.

Three gaps are between dies on the interposer 12. A first gap is between the first die 18 and the second die 20 and has a first distance 40. A second gap is between the second die 20 and the third die 22 and has a second distance 42. A third gap is between the third die 22 and the fourth die 24 and has a third distance 44.

The three gaps have a value for the distances that controls warpage of the structure 10. The value can be described as an average distance for the gaps between adjacent dies. The average distance can be determined as a function of the number of dies, and the average distance can control a critical warpage value of the structure 10. More particularly, the average distance may be represented generally by the graph in FIG. 5, as discussed in more detail below. It should be noted that the distances of the gaps do not have to be equal to each other, although the distances can be equal. The distances can have different values, but in embodiments, the sum of all of the distances is equal to or less than the average distance times the number of gaps.

Figure 2:
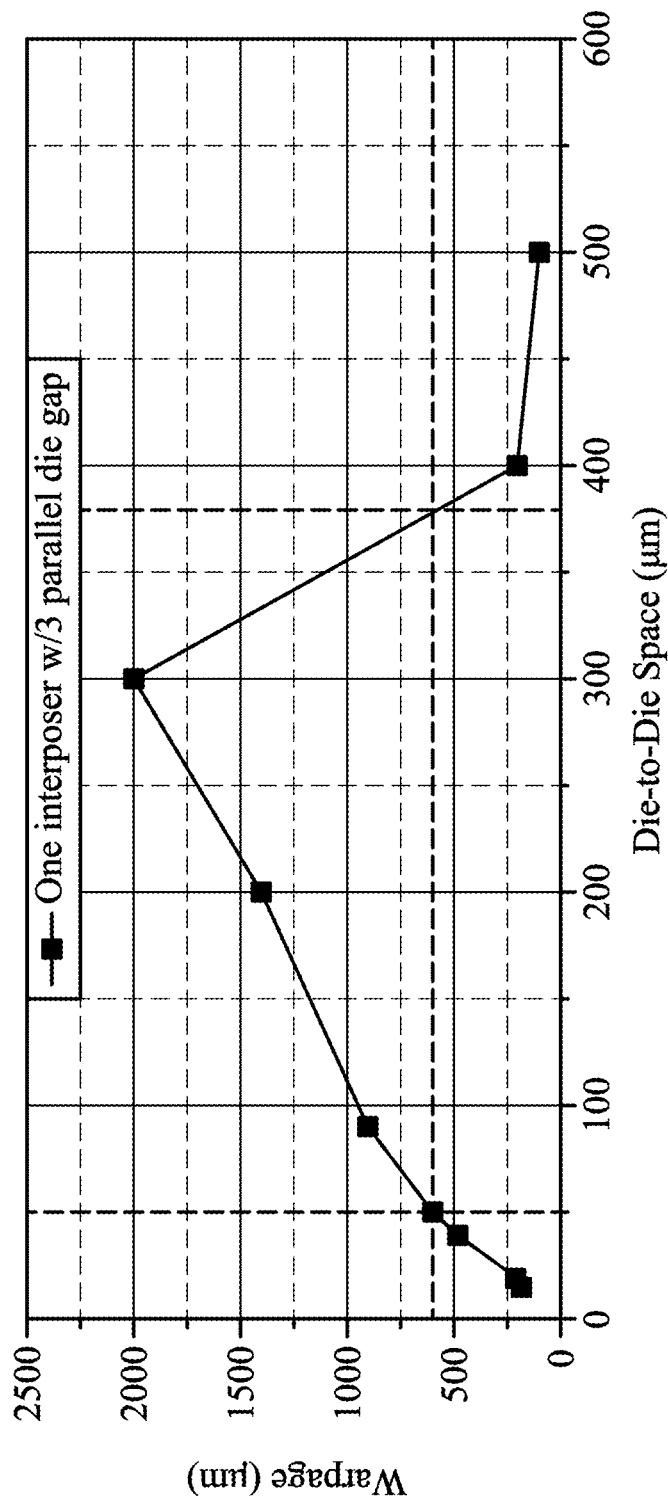
FIG. 2 is a graph depicting warpage of a wafer relative to a die-to-die spacing with the structure in FIGS. 1A and 1B.

In the disclosed embodiments, a warpage value with a deflection of 600 micrometers in a 12 inch wafer comprising the substrate 13 was assumed because at that deflection significant delamination of an underfill, cracking of bumps, and/or cracking of TSVs may occur and at that deflection a process during backside processing of the substrate 13 can be impacted. The first die 18, the second die 20, the third die 22, and the fourth die 24 each have a thickness, e.g., in a direction orthogonal to the front side surface of the interposer 12, that is approximately 770 micrometers. The interposer 12 has a combined die attach area for the first die 18, the second die 20, the third die 22, and the fourth die 24 on the front side surface of the interposer 12 that is approximately 680 square millimeters. Under these conditions, the average distance of the three gaps in the structure 10 is 50 micrometers or less, for example, each of the distances of the gaps can be 50 micrometers or less. Thus, the total sum of the distances of the three gaps is 150 micrometers or less, and the distances of the three gaps may be allocated equally or unequally. As shown in FIG. 2, as long as the average die-to-die spacing (the distances 40, 42, and 44 in FIGS. 1A and 1B) remains equal to or less than 50 micrometers, the warpage, e.g., the deflection of the wafer during processing of the structure 10, remains no more than 600 micrometers.

For structures having more than four dies, the average spacing saturates at 50 micrometers or less, assuming all other conditions as previously discussed. Thus, for a five die structure with four gaps, the total sum of the gap distances is 200 micrometers or less. As with above, the gap distances may be equal or unequal.

Figure 3A:
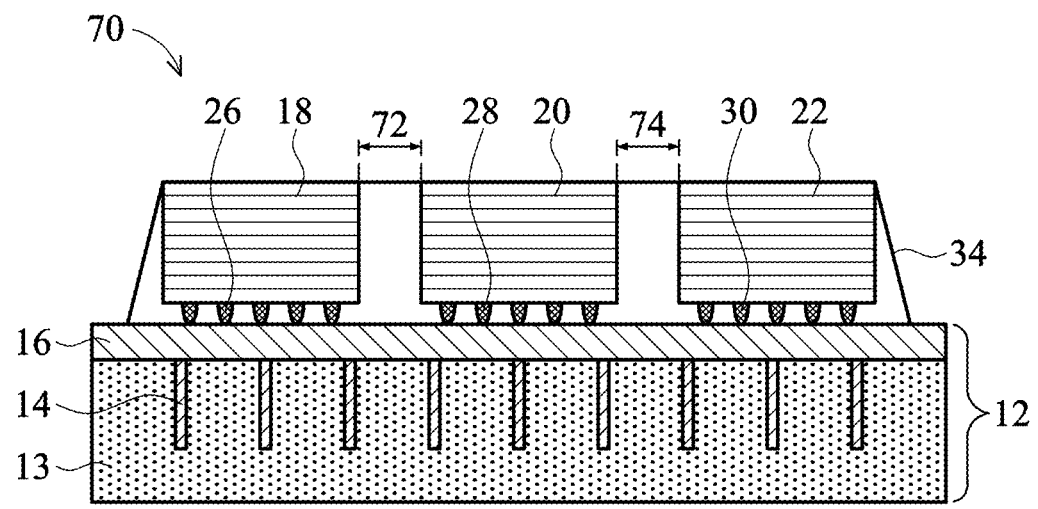
FIGS. 3A and 3B are a cross section view and a layout view, respectively, of a three die 2.5DIC structure according to another embodiment.
Figure 3B:
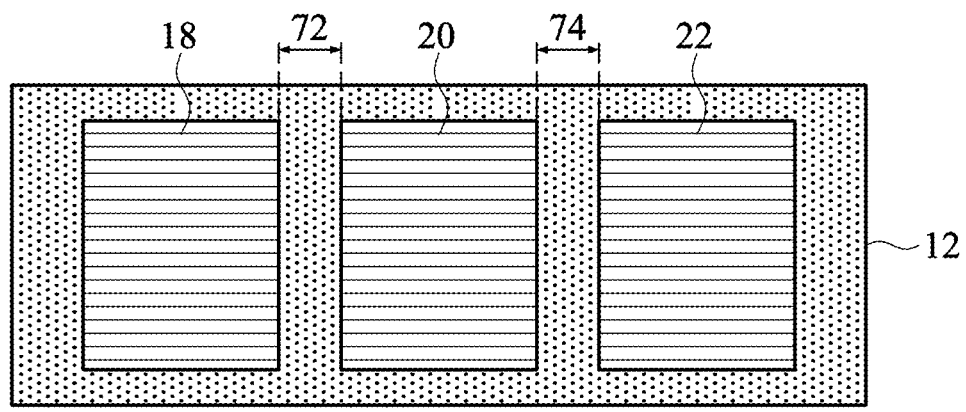

FIGS. 3A and 3B illustrate a cross section view and a layout view, respectively, of a three die 2.5DIC structure 70 according to another embodiment. The structure 70 is similar to the structure 10 of FIGS. 1A and 1B. The structure 70 includes the first die 18, the second die 20, and the third die 22 attached to the interposer 12 by first connectors 26, second connectors 28, and third connectors 30, respectively. In this three die structure 70, there are two gaps between respective adjacent dies. A gap between the first die 18 and the second die 20 has a first distance 72, and a gap between the second die 20 and the third die 22 has a second distance 74.

As with above, the gaps have a value for the distances that controls warpage of the wafer comprising the substrate 13, and the value can be described as an average distance that is based upon the number of dies. Given the same dimensions discussed previously with respect to the structure 10 in FIGS. 1A and 1B, with a different die area on the interposer due to fewer dies being present, the average distance for the gaps between dies in the structure 70 is approximately 125 micrometers or less, for example each of the distances of the gaps can be equal to or less than 125 micrometers.

Figure 4A:
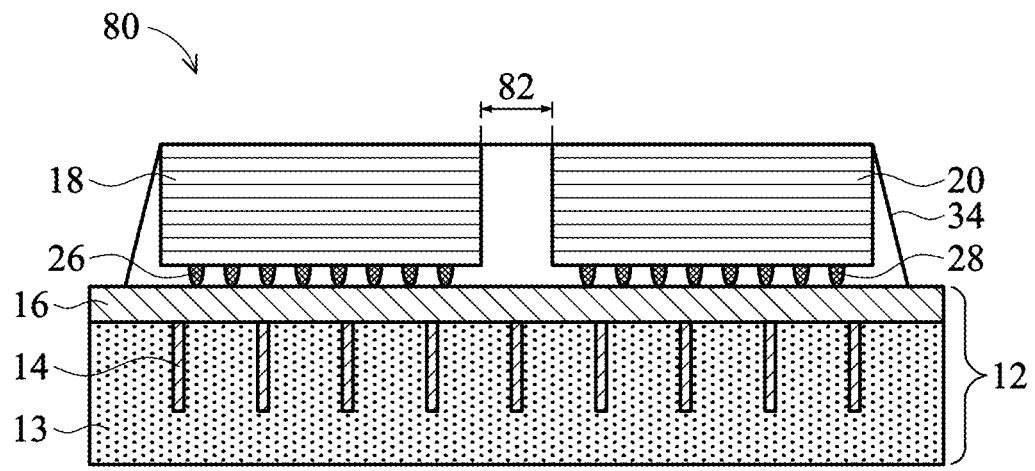
FIGS. 4A and 4B are a cross section view and a layout view, respectively, of a two die 2.5DIC structure according to a further embodiment.
Figure 4B:
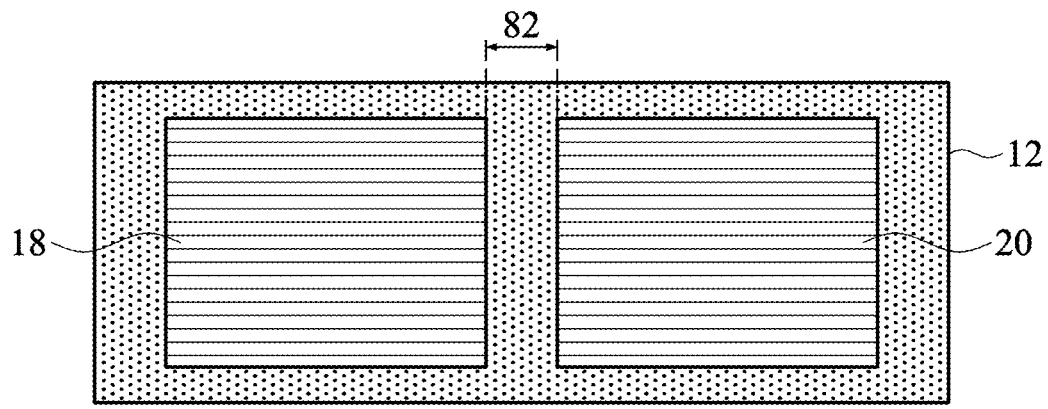

FIGS. 4A and 4B illustrate a cross section view and a layout view, respectively, of a two die 2.5DIC structure 80 according to another embodiment. The structure 80 is similar to the structure 10 of FIGS. 1A and 1B. The structure 80 includes the first die 18 and the second die 20 attached to the interposer 12 by first connectors 26 and second connectors 28, respectively. In this two die structure 80, there is one gap between the dies. The gap between the first die 18 and the second die 20 has a first distance 82.

As with above, the gap has a value for the distance that controls warpage of the wafer comprising the substrate 13, and the value can be described as a distance that is based upon the number of dies. Given the same dimensions discussed previously with respect to the structure 10 in FIGS. 1A and 1B, with a different die area on the interposer, the distance for the gap between dies in the structure 80 is approximately 200 micrometers or less.

Figure 5:
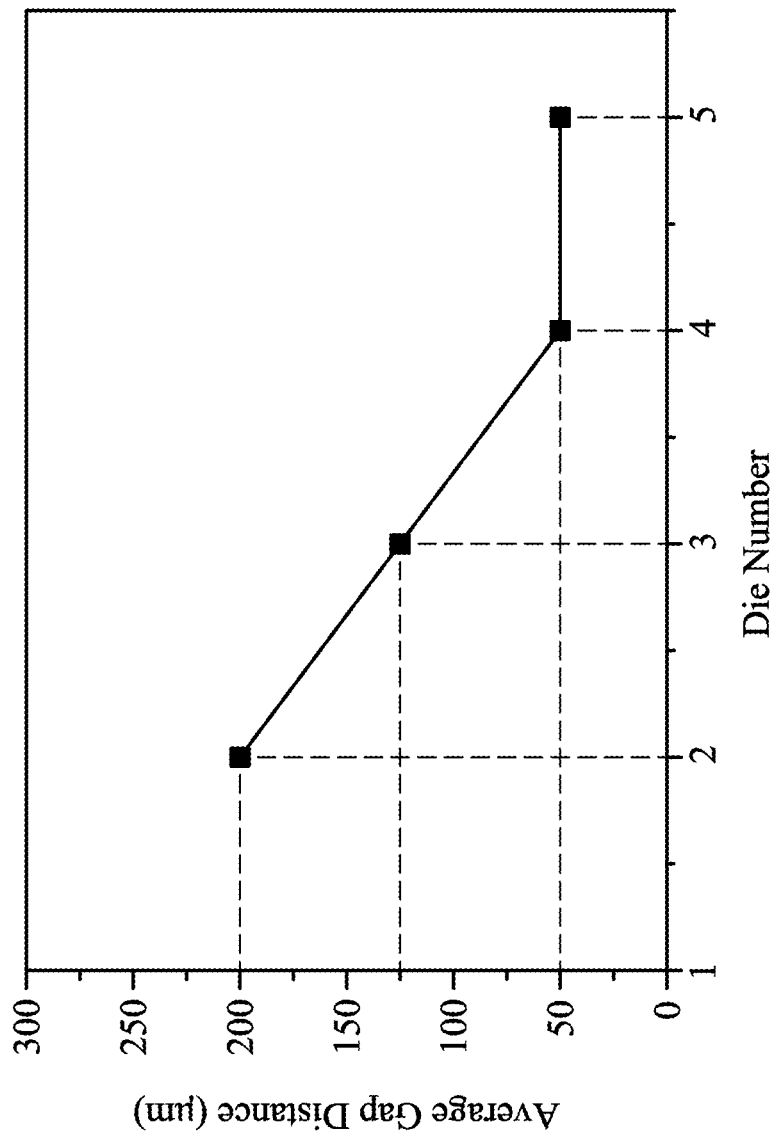
FIG. 5 is a graph showing an average gap distance as a function of number of dies on a structure according to embodiments.

FIG. 5 illustrates the average gap distance for structures with various numbers of dies to control warpage of the structure. As previously discussed, the average gap distance for structures with four or more dies has an average gap distance between dies of 50 micrometers or less. The average distance saturates at approximately 50 micrometers or less for structures having four dies or greater. The average gap distance for structures with three dies has an average gap distance between dies of 125 micrometers or less. The gap distance for structures with two dies has a gap distance of 200 micrometers or less. As with above, the average gap distance can be less than these identified values, and thus, gaps between adjacent dies in a structure can each be less than these identified values for a corresponding structure.

Figure 6:
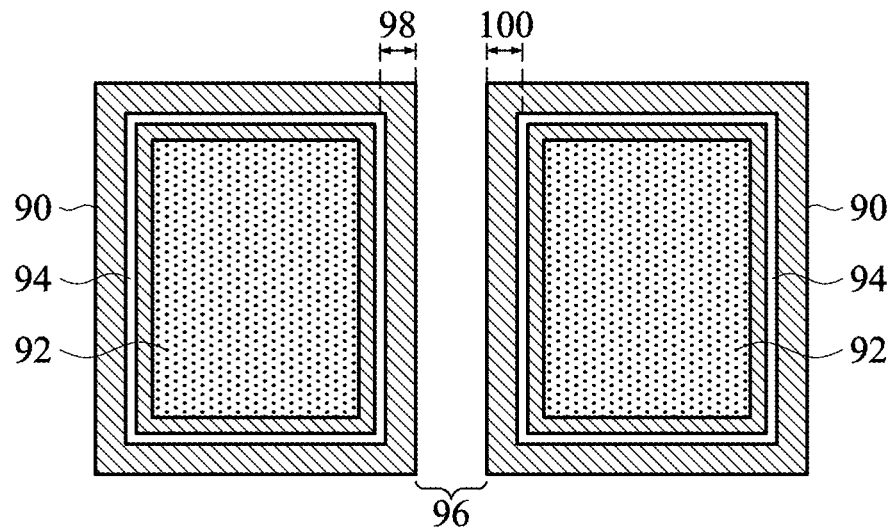
FIG. 6 is dies singulated from a wafer according to an embodiment.

FIG. 6 illustrates further features of embodiments. FIG. 6 shows dies 90 as they are being singulated from a processed wafer. Each of the dies 90 includes an active region 92 enclosed by a seal ring 94. In embodiments, a saw blade width is decreased to cause a narrower kerf width 96 between singulated dies 90. The dies 90 can have excess substrate material of the die wafer between respective seal rings 94 and die edges, such as having a distance 98 or a distance 100. For example, each of distance 98 and distance 100 may be equal to or greater than 15 micrometers.

By using a narrower saw blade or designing a wider scribe line, embodiments can be integrated into existing processes. For example, the processing of a wafer may not need to be modified to obtain dies with excess substrate material between a seal ring 94 and a die edge. Further, the footprint of the connectors on the interposer 12, or active die as the case may be, to which the die 90 will connect may not need to be modified to achieve the gap distances disclosed herein. The excess material may cause the die to have a greater area thereby reducing the distance between an adjacent die.

Figure 7:
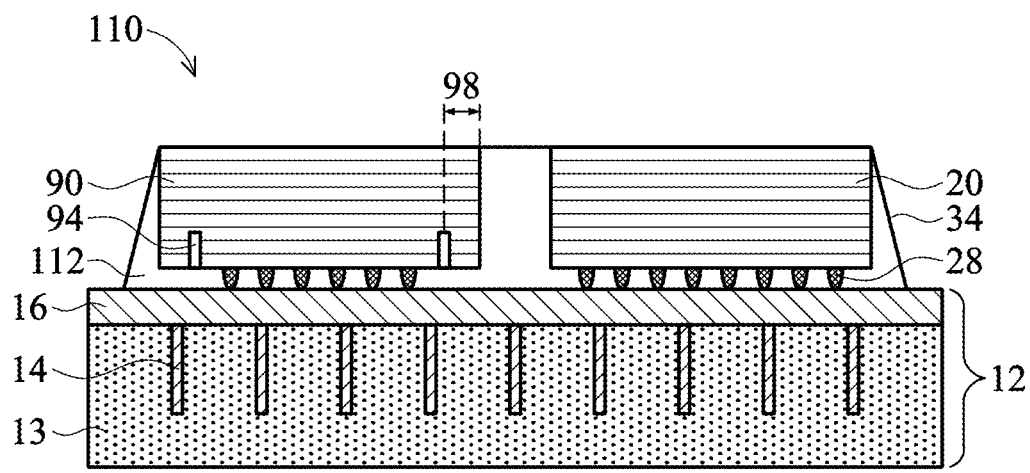
FIG. 7 is a cross section view of a two die 2.5DIC structure with a die shown in FIG. 6 according to an embodiment.

FIG. 7 illustrates a cross section view of a two die 2.5DIC structure 110. The structure 110 is similar to the structure 80 of FIG. 4A. The first die 18 of the structure 80 is replaced with a die 90 in the structure 110 of FIG. 7. The die 90 is attached to the front side of the interposer 12 with connectors 112 having a footprint smaller than the area of the die 90. The excess material along outer regions of the die 90 has the distance 98 which reduces the distance of the gap between the die 90 and the second die 20 to achieve the distance disclosed with respect to FIG. 4A. It should be appreciated that embodiments contemplate using features of the die 90 for all dies in a structure, some dies, or none of the dies, and for structures having any number of dies.

Referring back to FIG. 2, the warpage of a structure can be controlled, such as below a 600 micrometer deflection, by having a greater average distance between dies. In these embodiments, the die-to-die spacing can be greater than approximately 380 micrometers, such as between approximately 380 micrometers to approximately 600 micrometers. This die-to-die spacing can be an average gap distance for a structure comprising any number of dies.

Figure 8B:
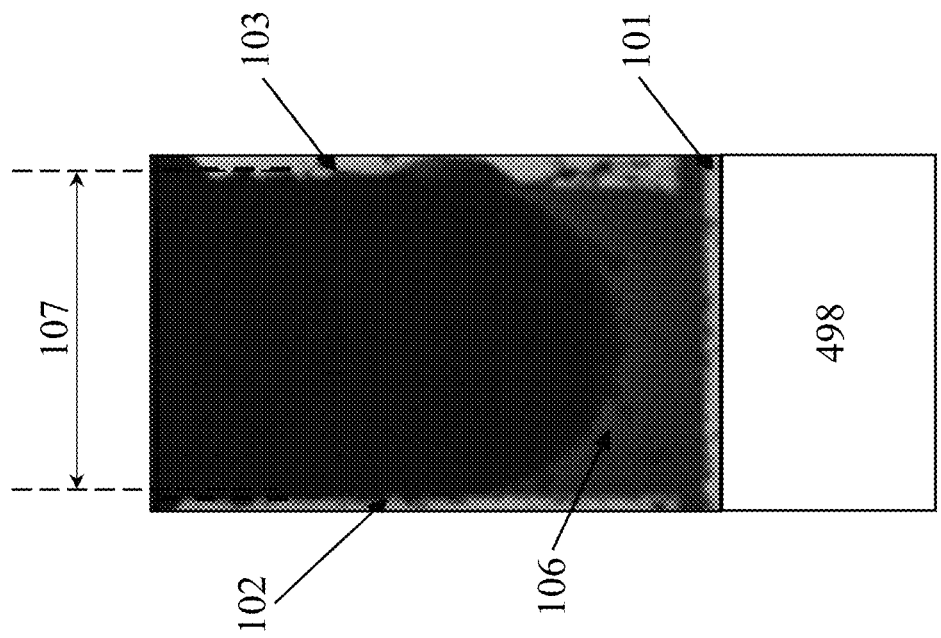
FIGS. 8A and 8B are portions of images of structures according to embodiments.
Figure 8A:
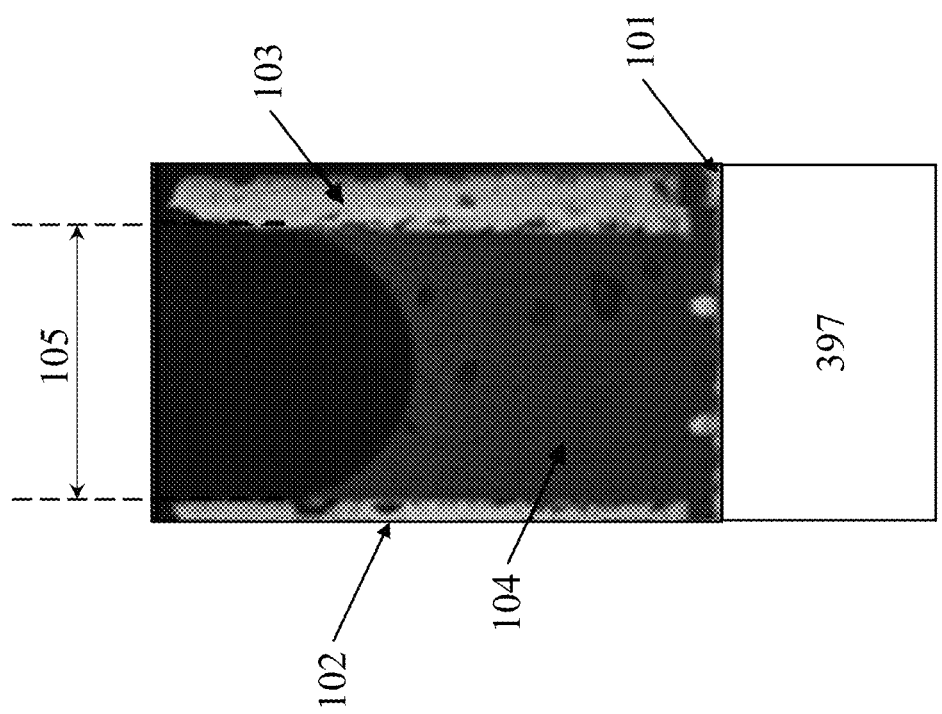

Further, in these embodiments, an underfill material bridges the gap between adjacent dies. FIGS. 8A and 8B are portions of images of example gaps with an underfill material bridging between adjacent dies having different gap distances. The structures having the gaps shown in FIGS. 8A and 8B can be similar to the structures shown in FIGS. 1A, 1B, 3A, 3B, 4A, any 4B, except have an average gap distance between approximately 380 micrometers and 600 micrometers. In FIG. 8A, the structure comprises a first die 102 and a second die 103 attached to a substrate 101. An underfill material 104 is between the first die 102 and the second die 103 bridging the gap distance 105. The gap distance 105 in this embodiment is approximately 400 micrometers, such as 397 micrometers. In FIG. 8B, a structure similar to the structure in FIG. 8A has a gap distance 107 of approximately 500 micrometers, such as 497 micrometers. An underfill material 106 is between the first die 102 and the second die 103 bridging the gap distance 107.

FIGS. 9A through 9H illustrate a method of forming structures, such as the two die structure 80 of FIG. 4A or the structures of FIG. 8A or 8B, according to an embodiment. It should be appreciated that this order is provided for illustrative purposes, and that other sequences may be used. Further, a person having ordinary skill in the art will readily understand modifications to the method to form other structures disclosed herein and, even further, structures contemplated in other embodiments.

Figure 9A:
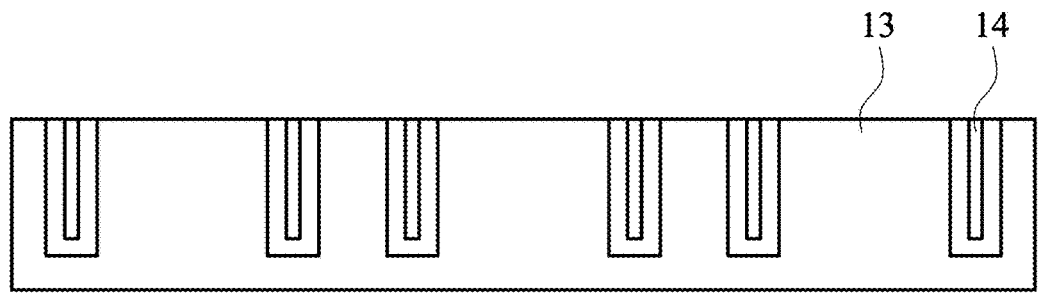
FIGS. 9A through 9H are a method of forming structures according to an embodiment.

Referring first to FIG. 9A, a substrate 13, which is processed as a part of a wafer, is shown with TSVs 14 formed through a front side of the substrate 13. The substrate 13 can have active devices formed, for example, in a front side surface of the substrate 13, and thus, can be a die for a 3DIC structure. The substrate 13 can have no active devices in the substrate 13, and thus, can be a passive interposer for a 2.5DIC structure. In other embodiments, the substrate 13 can have active devices in the substrate 13 and be an active interposer for a 2.5DIC structure.

The substrate 13 generally comprises a material similar to the substrate used to form a die that will be attached to the interposer, such as silicon. While the substrate 13 may be formed of other materials, it is believed that using silicon substrates for the interposer or die may reduce stress because the coefficient of thermal expansion (CTE) mismatch between the silicon substrates and the silicon typically used for the dies is lower than with substrates formed of different materials.

The TSVs 14 are formed by forming recesses in the substrate 13 by, for example, etching, milling, laser techniques, a combination thereof, and/or the like. A thin barrier layer is conformally deposited over the front side of the substrate 13 and in the openings, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electrochemical plating (ECP) process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 13 by, for example, chemical mechanical polishing (CMP). Thus, the TSVs 14 comprise a conductive material and a thin barrier layer between the conductive material and the substrate 13.

Figure 9B:
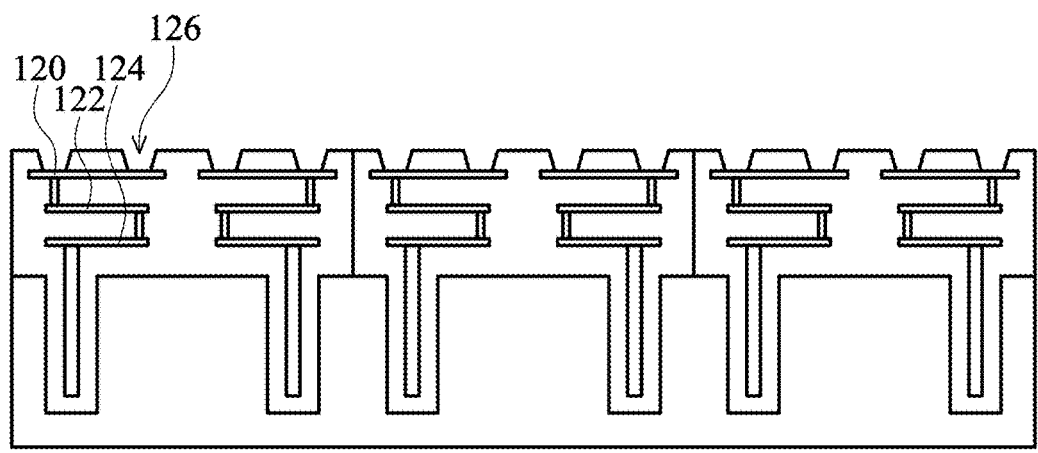

Front side processing continues in FIG. 9B with the formation of the RDL 16. The RDL 16 may comprise any number or combination of metallization layers, inter-metal dielectric (IMD) layers, vias, and passivation layers. The RDL 16 depicted in FIG. 9B comprises three metallization layers, such as a first metallization layer (M1) 120, a second metallization layer (M2) 122, and a third metallization layer (M3) 124, in IMD layers. Vias are formed between metallization layers in the IMD layers. The metallization layers are formed by depositing an IMD layer, etching the metallization pattern of the layer in the IMD layer using, for example, acceptable photolithography techniques, depositing a conductive material for the metallization in the IMD, and removing any excess conductive material by, for example, CMP. The photolithography technique may include a single damascene process or a dual damascene process, particularly when vias are formed through an IMD to an underlying metallization layer.

The IMD layers can be an oxide dielectric, such as a borophosphosilicate glass (BPSG), or other dielectric material. The conductive material of the metallization layers may be, for example, copper, nickel, aluminum, copper aluminum, tungsten, titanium, combinations thereof, and/or the like. The metallization layers may include barrier layers, such as titanium nitride, tantalum nitride, the like, or a combination thereof, between the conductive material and the IMD material, and other dielectric layers, such as etch stop layers made of, for example, silicon nitride, may be formed between the IMD layers.

After the formation of the top metallization layer, the third metallization layer 124 in FIG. 9B, one or more passivation layers are formed over the metallization layers. The passivation layer(s) may be a polyimide, a BPSG, silicon nitride, a combination thereof, and/or the like, and may be formed using a spin-on technique, CVD, ALD, PVD, a combination thereof, and/or the like. Openings 126 are formed through the passivation layers to expose the top metallization layer, the third metallization layer 124 in FIG. 9B, for the formation of bump bond pads on the top metallization layer. The openings 126 may be formed using, for example, acceptable photolithography and etching techniques.

Figure 9C:
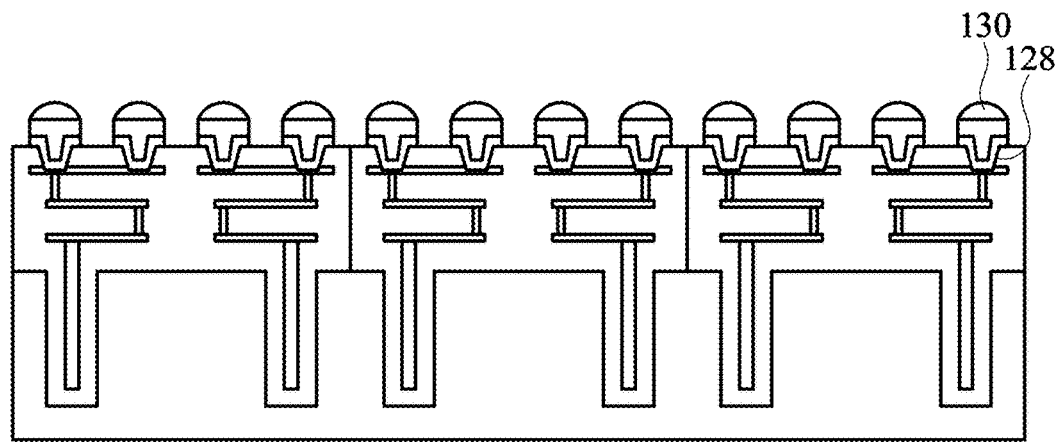

Referring to FIG. 9C, bump bond pads 128 are formed through the openings 126 on the top metallization layer, and conductive bumps 130 are formed on the bump bond pads 128. The conductive bumps 130 generally correspond to first connectors 26 and second connectors 28. The bump bond pads 128 may be formed by depositing a conductive material in the openings 126 and patterning the conductive material into the bump bond pads 128. The conductive material may comprise copper, silver, tin, titanium, tungsten, a combination thereof, and/or the like, and may be deposited by PVD, CVD, ALD, a combination thereof, and/or the like. The patterning of the bump bond pads 128 may be by acceptable photolithography and etching techniques. The conductive bumps 130 are formed on the bump bond pads 128 by ECP, and/or the like, and may comprise copper, tin, nickel, a combination thereof, and/or the like.

Figure 9D:
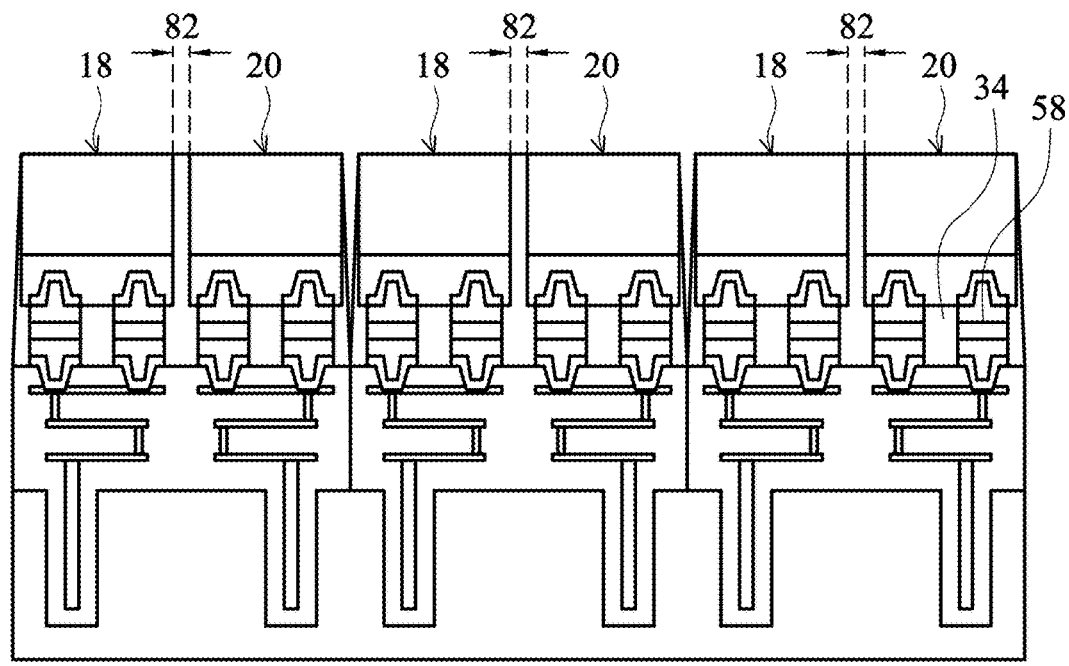

In FIG. 9D, first dies 18 and second dies 20 are attached by the conductive bumps 130. The first dies 18 and second dies 20 have respective gaps therebetween with each gap having the distance 82 between the first die 18 and the second die 20, as discussed with regard to FIGS. 4A and 4B or 8A and 8B. The underfill material 34 is dispensed around the bumps 130 and between the dies 18 and 20 and the interposer 12, or active die. The underfill material 34 is also in the gap between respective first dies 18 and second dies 20.

The dies 18 and 20 may be processed according to acceptable semiconductor processing techniques and device requirements. In embodiments, one or both of the dies 18 and 20 are processed according to FIG. 6, with excess wafer substrate material between a die edge and a seal ring. The dies 18 and 20 may be known good dies attached using a pick-and-place tool, and the conductive bumps 130 may be reflowed before the underfill material 34 is dispensed. The underfill material 34 may be a liquid epoxy, deformable gel, silicon rubber, dry film, a combination thereof, and/or the like dispensed using acceptable dispensing or coating equipment.

Figure 9E:
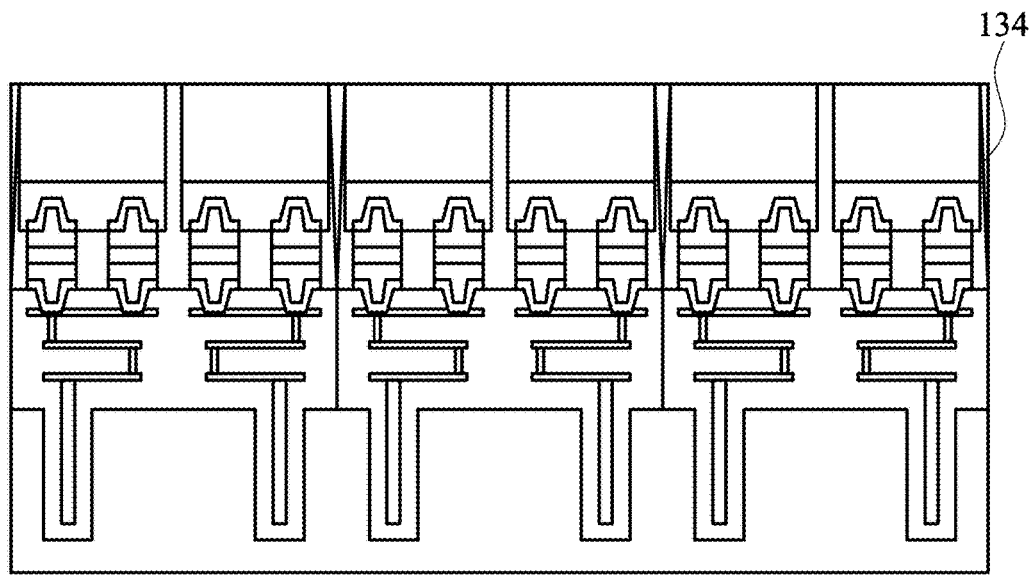

In FIG. 9E, after the underfill material 34 is cured, the dies 18 and 20 are encapsulated by applying a molding compound 134 and using compression molding, for example. If molding compound 134 is over the top surfaces of the dies 18 and 20, the molding compound 134 may be ground, for example, by a CMP, to expose surfaces of the dies 18 and 20.

Figure 9F:
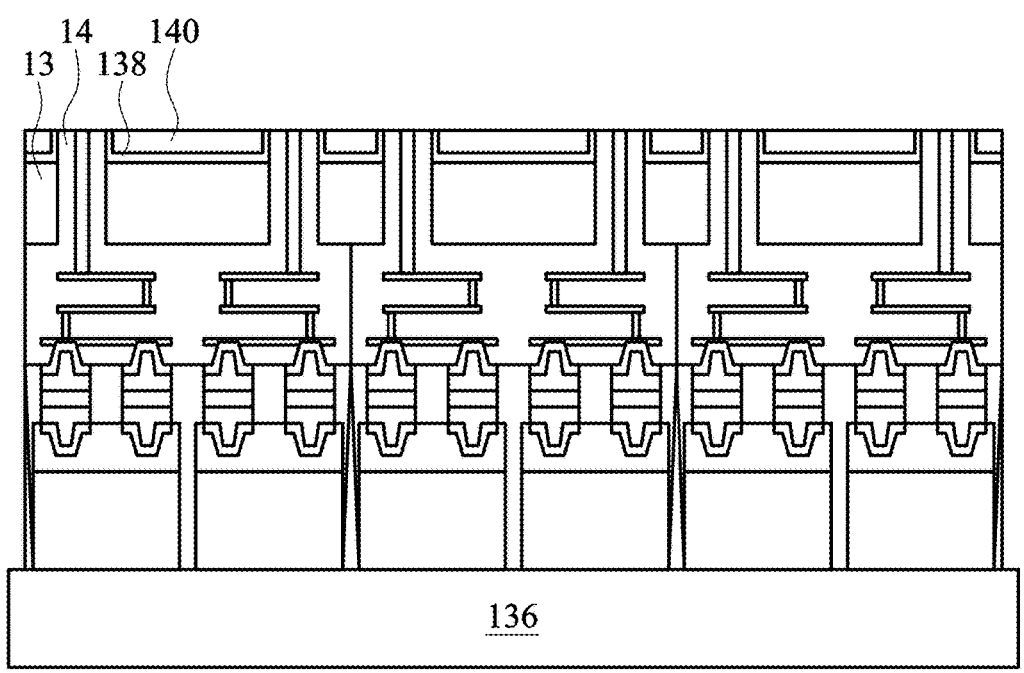

Back side processing of the substrate 13 is depicted as beginning in FIG. 9F. The chip on wafer (CoW) of FIG. 9E is attached to a carrier substrate 136 during the back side processing. The carrier substrate 136 may be attached to the dies 18 and 20 and/or the molding compound 134 using an adhesive. Generally, the carrier substrate 136 provides temporary mechanical and structural support during subsequent processing steps. In this manner, damage to an interposer or dies is reduced or prevented. The carrier substrate 136 may comprise, for example, glass, silicon oxide, aluminum oxide, a combination thereof, and/or the like. The adhesive may be any suitable adhesive, such as ultraviolet (UV) glue, which loses its adhesive property when exposed to UV lights.

In FIG. 9F, TSVs 14 protrude from the back side of the substrate 13 by thinning the substrate 13. The thinning process may be performed using an etching process and/or a planarization process, such as a CMP process. For example, initially a planarizing process, such as a CMP, may be performed to initially expose the barrier layer of the TSVs 14. Thereafter, one or more wet etching processes having a high etch-rate selectivity between the material of the barrier layer and the substrate 13 may be performed, thereby leaving the TSVs 14 protruding from the back side of the substrate 13. The etch process may also be, for example, a dry etch process. One or more dielectric layers, such as dielectric layer 138 and 140 shown in FIG. 9F, are deposited over the back side of the substrate 13. The dielectric layers 138 and 140 may be, for example, silicon oxide, silicon nitride, silicon oxynitride, a combination thereof, and/or the like. The back side is then planarized, for example, by CMP, such that the TSVs 14 are exposed on the back side.

Figure 9G:
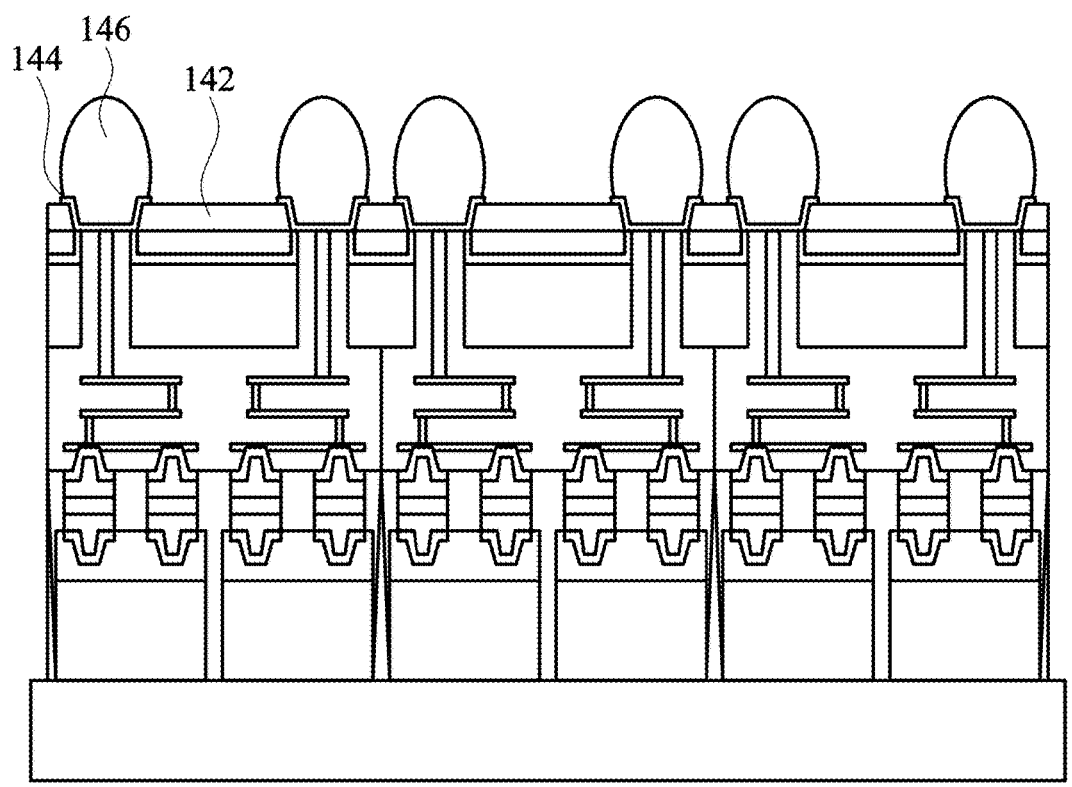

FIG. 9G shows the formation of a passivation layer 142, ball bond pads 144, and conductive balls 146. The passivation layer 142 is formed on the back side over the dielectric layers 138 and 140, and may be, for example, a polyimide, BPSG, polybenzoxazole (PBO), a combination thereof, and/or the like, formed by a spin-on technique, CVD, ALD, a combination thereof, and/or the like. Openings are formed through the passivation layer 142 to expose, for example, the TSVs 14, for the formation of ball bond pads 144. The openings may be formed using, for example, acceptable photolithography and etching techniques. The ball bond pads 144 may be formed by depositing a conductive material, such as a metal, for example, one or more layers of chrome, a chrome-copper alloy, copper, gold, titanium, titanium tungsten, nickel, combinations thereof, or the like, in the openings and patterning the conductive material into the ball bond pads 144. The conductive material may be deposited by ECP, printing, and/or the like, and the patterning may be by acceptable photolithography and etching techniques. The conductive balls 146 are formed on the ball bond pads 144 by ECP, printing, and/or the like, and may comprise copper, tin, eutectic solder, lead free solder, nickel, a combination thereof, and/or the like.

It should be noted that FIG. 9G depicts the ball bond pads 144 as directly coupled to the TSVs 14; however, one or more metallization layers and IMD layers may be formed on the back side of the substrate 13 to electrically couple the ball bond pads 144 to the TSVs 14. The back side metallization layers may be formed of any suitable conductive material, such as copper, copper alloys, aluminum, silver, gold, combinations thereof, and/or the like, formed by any suitable technique, such as ECP, electroless plating, other deposition methods such as sputtering, printing, CVD, PVD, a combination thereof, and/or the like.

Figure 9H:
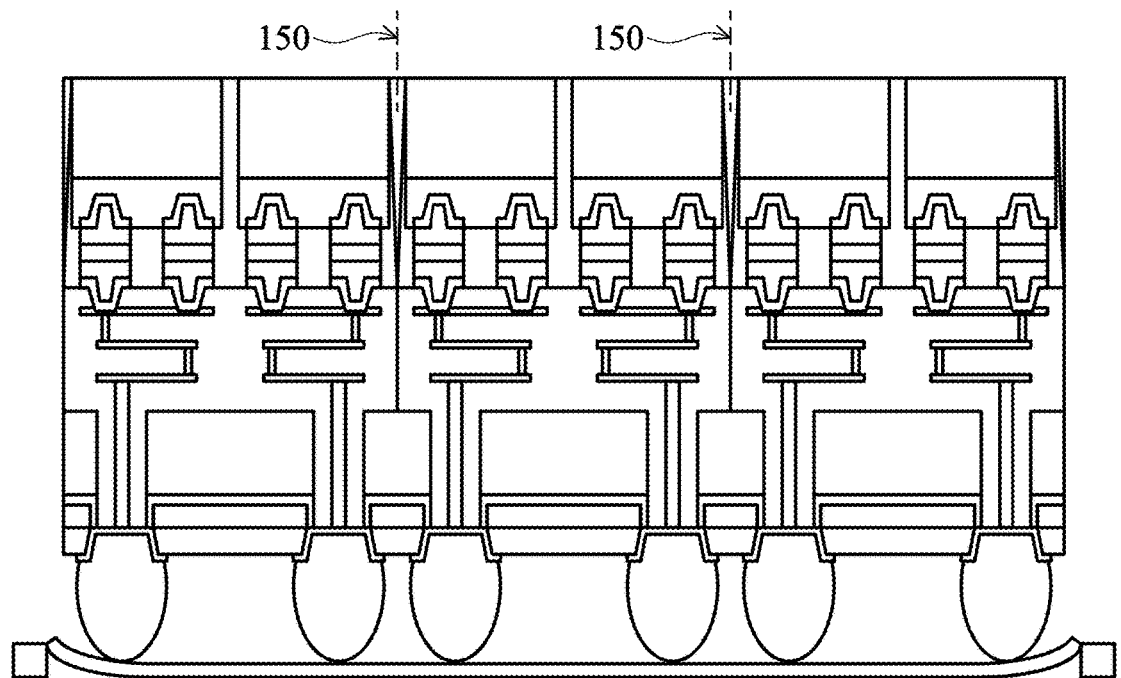

The assembly is then attached to a dicing frame 148, with the conductive balls 146 adjoining the dicing frame 148, and the carrier substrate 136 is removed, as shown in FIG. 9H. The assembly is then diced, such as along dicing lines 150, into individual packages with an interposer and any number of dies, such as the structure 80 shown in FIG. 4A, 8A, or 8B.

Embodiments may achieve advantages. Wafer warpage control during processing after a die attach process can be realized by controlling the die-to-die spacing. This may reduce wafer warpage which can reduce stresses in the structure, thereby reducing TSV and/or bump cracking and/or underfill delamination. Embodiments may thus allow for a larger process window and a larger yield. Also, wafer handling may be easier because of a reduced risk of problems caused by warpage. Further, electrical lines between dies may be shorter in embodiments allowing for lower resistances and capacitances.

An embodiment is a structure comprising a substrate, a first die, and a second die. The substrate has a first surface and a second surface opposite the first surface. The substrate has a through substrate via extending from the first surface towards the second surface. The first die is attached to the substrate, and the first die is coupled to the first surface of the substrate. The second die is attached to the substrate, and the second die is coupled to the first surface of the substrate. A first distance is between a first edge of the first die and a first edge of the second die, and the first distance is in a direction parallel to the first surface of the substrate. The first distance is equal to or less than 200 micrometers.

Another embodiment is a structure comprising a substrate and at least two dies. The substrate has a through substrate via extending from a first surface of the substrate. The at least two dies are each coupled to the first surface of the substrate, and the at least two dies have an average distance between adjacent ones of the at least two dies. The average distance is in a direction parallel to the first surface, and the average distance is equal to or less than 200 micrometers.

Another embodiment is a structure. The structure comprises a substrate, a first die, a second die, and an underfill material. The substrate has a first surface and a second surface opposite the first surface, and the substrate has a through substrate via extending from the first surface towards the second surface. The first die is attached to the substrate, and the first die is coupled to the first surface of the substrate. The second die is attached to the substrate, and the second die is coupled to the first surface of the substrate. A first distance is between a first edge of the first die and a first edge of the second die, and the first edge of the first die and the first edge of the second die are first adjacent die edges. The first distance is equal to or greater than 380 micrometers. The underfill material is between the first edge of the first die and a second edge of the second die.

A further embodiment is a method comprising attaching at least two dies to a first surface of a substrate. The substrate has a through substrate via extending from the first surface. The at least two dies have an average spacing between adjacent ones of the at least two dies, and the average spacing is in a direction parallel to the first surface of the substrate. The average spacing is 200 micrometers or less. The method further comprises processing a second surface of the substrate after attaching the at least two dies, the second surface being opposite the first surface.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    attaching at least two dies to a first surface of a substrate, the substrate having a through substrate via extending therefrom, the at least two dies having an average spacing between adjacent ones of the at least two dies, the average spacing being in a direction parallel to the first surface of the substrate, the average spacing being 200 micrometers or less, wherein at least one of the at least two dies comprises a seal ring and an edge of the at least one of the at least two dies, the edge adjoining the spacing between adjacent ones of the at least two dies, a distance in the direction parallel to the first surface from the seal ring to the edge being greater than 10 micrometers;
    forming an underfill material between the substrate and each of the at least two dies, the underfill material up along sidewalls of the at least two dies;
    forming an encapsulant over the first surface of the substrate and the underfill material and around the at least two dies; and
    processing a second surface of the substrate after attaching the at least two dies, the second surface being opposite the first surface.

2. The method of claim 1, wherein the processing includes exposing the through substrate via through the second surface of the substrate.

3. The method of claim 1, wherein the forming the underfill material further comprises:
    dispensing an underfill material between the substrate and each of the at least two dies; and
    curing the underfill material.

4. The method of claim 1, wherein the at least two dies comprises three dies, the average spacing being 125 micrometers or less.

5. The method of claim 1, wherein the at least two dies comprises four dies, the average spacing being 50 micrometers or less.

6. A method comprising:
    attaching a first die to a first surface of a substrate, the first die comprising a seal ring and a first edge, the first edge being an outermost edge of the first die, a distance in a direction parallel to the first surface from the seal ring to the first edge being greater than 15 micrometers;
    attaching a second die to the first surface of the substrate, a first distance being between the first edge of the first die and a first edge of the second die, the first distance being in a direction parallel to the first surface of the substrate, the first distance being equal to or less than 200 micrometers;
    forming an underfill between the substrate and each of the first die and the second die, the underfill extending up along the first edge of the first die and the first edge of the second die;
    forming an encapsulant over the first surface of the substrate and over the first die and the second die, the encapsulant contacting the first edge of the first die and the first edge of the second die; and
    grinding a surface of the encapsulant, wherein after the grinding, a surface of the first die distal from the first surface of the substrate and a surface of the second die distal from the first surface of the substrate are exposed through the encapsulant.

7. The method of claim 6 further comprising:
    attaching a third die to the first surface of the substrate, a second distance being between a second edge of the second die and a first edge of the third die, the second distance being in a direction parallel to the first surface of the substrate, a sum of the first distance and the second distance being equal to or less than 250 micrometers.

8. The method of claim 7, wherein each of the first distance and the second distance is equal to or less than 125 micrometers.

9. The method of claim 7 further comprising:
    attaching a fourth die to the first surface of the substrate, a third distance being between a second edge of the third die and a first edge of the fourth die, the third distance being in a direction parallel to the first surface of the substrate, a sum of the first distance, the second distance, and the third distance being equal to or less than 150 micrometers.

10. The method of claim 9, wherein each of the first distance, the second distance, and the third distance is equal to or less than 50 micrometers.

11. The method of claim 6, wherein the substrate is an interposer substrate.

12. The method of claim 6, wherein the substrate is an active die substrate.

13. The method of claim 6 further comprising:

forming a through substrate via extending from the first surface of the substrate towards a second surface of the substrate, the second surface being opposite the first surface, at least one of the first die and the second die being coupled to the through substrate via.

14. A method comprising:

forming a through substrate via extending from a first surface of a substrate towards a second surface of the substrate, the second surface being opposite the first surface;

attaching a first die to the first surface of a substrate, the first die comprising a seal ring and a first edge, the first edge being an outermost edge of the first die, a distance in a direction parallel to the first surface from the seal ring to the first edge being greater than 15 micrometers;

attaching a second die to the first surface of the substrate, a first distance being between the first edge of the first die and a first edge of the second die, the first distance being in a direction parallel to the first surface of the substrate, the first distance being equal to or greater than 380 micrometers, at least one of the first die and the second die being coupled to the through substrate via;

forming an underfill between the substrate and each of the first die and the second die, the underfill extending up along the first edge of the first die and the first edge of the second die;

forming an encapsulant over the first surface of the substrate and around the first die and the second die;

thinning the substrate from the second surface of the substrate, the thinning exposing a surface of the through substrate via through the second surface of the substrate; and forming a conductive connector on the exposed surface of the through substrate via.

15. The method of claim 14, wherein the first distance is less than 600 micrometers.

16. The method of claim 14 further comprising:

attaching a third die attached to the first surface of the substrate, a second distance being between a second edge of the second die and a first edge of the third die, the second edge of the second die and the first edge of the third die being second adjacent die edges, the second distance being greater than 380 micrometers.

17. The method of claim 14 further comprising:

attaching a fourth die attached to the first surface of the substrate, a third distance being between a second edge of the third die and a first edge of the fourth die, the second edge of the third die and the first edge of the fourth die being third adjacent die edges, the third distance being greater than 380 micrometers.

18. The method of claim 14, wherein the substrate is an interposer substrate, an active die substrate, or a combination thereof.

19. The method of claim 1, wherein the distance is greater than 15 micrometers.

20. The method of claim 14 further comprising:

dicing the encapsulant and the substrate to form a package structure.

* * * * *